(12) United States Patent
McCarthy et al.

(10) Patent No.: US 7,702,840 B1
(45) Date of Patent: Apr. 20, 2010

(54) INTERFACE DEVICE LANE CONFIGURATION

(75) Inventors: Patrick C. McCarthy, San Francisco, CA (US); Laurent F. Stadler, San Francisco, CA (US)

(73) Assignee: XILINX, Inc., San Jose, CA (US)

(\*) Notice: Subject to any disclaimer, the term of this patent is extended or adjusted under 35 U.S.C. 154(b) by 262 days.

(21) Appl. No.: 11/803,556

(22) Filed: May 14, 2007

(51) Int. Cl.
G06F 13/00 (2006.01)
G06F 13/36 (2006.01)
H05K 7/10 (2006.01)

(52) U.S. Cl. ............... 710/305; 710/301; 710/314
(58) Field of Classification Search ............ 710/305, 710/301, 314
See application file for complete search history.

(56) References Cited

U.S. PATENT DOCUMENTS

| | | | |
|---|---|---|---|
| 5,703,498 A | 12/1997 | Gould et al. | |
| 5,781,756 A | 7/1998 | Hung | |
| 5,857,086 A | 1/1999 | Horan et al. | |
| 5,892,961 A | 4/1999 | Trimberger | |
| 6,067,595 A | 5/2000 | Lindenstruth | |
| 6,160,418 A | 12/2000 | Burnham | |
| 6,204,687 B1 | 3/2001 | Schultz et al. | |
| 6,241,400 B1 | 6/2001 | Melo et al. | |
| 6,292,021 B1 | 9/2001 | Furtek et al. | |
| 6,294,925 B1 | 9/2001 | Chan et al. | |
| 6,340,897 B1 | 1/2002 | Lytle et al. | |
| 6,522,167 B1 | 2/2003 | Ansari et al. | |
| 6,792,578 B1 | 9/2004 | Brown et al. | |
| 6,903,575 B1 | 6/2005 | Davidson et al. | |
| 6,915,365 B2 | 7/2005 | Creta et al. | |
| 6,976,160 B1 | 12/2005 | Yin et al. | |
| 7,003,423 B1 | 2/2006 | Kabani et al. | |
| 7,043,570 B2 | 5/2006 | Fry et al. | |
| 7,099,969 B2* | 8/2006 | McAfee et al. | 710/107 |
| 7,126,372 B2 | 10/2006 | Vadi et al. | |
| 7,190,190 B1 | 3/2007 | Camarota et al. | |
| 7,200,832 B2 | 4/2007 | Butt et al. | |
| 7,213,224 B2* | 5/2007 | Vogel et a | 716/16 |
| 7,274,213 B1 | 9/2007 | Meyer et al. | |
| 7,328,335 B1 | 2/2008 | Sundararajan et al. | |
| 7,353,162 B2 | 4/2008 | Huang et al. | |

(Continued)

OTHER PUBLICATIONS

"PCI Express Pipe Endpoint LogiCORE Product Specification," DS321 (v1.1), Apr. 11, 2005, pp. 1-14, Xilinx, Inc.
"PCI Express Endpoint Cores v3.4 Product Specification," DS506, Feb. 15, 2007, pp. 1-20, Xilinx, Inc.

(Continued)

*Primary Examiner*—Paul R Myers
*Assistant Examiner*—Jeremy S Cerullo
(74) *Attorney, Agent, or Firm*—W. Eric Webostad; John J. King (57) ABSTRACT

Lane configuration of an interface device of an integrated circuit is described. A core is used to tile a portion of an integrated circuit with a first version of the core and a second version of the core. The core is an application specific circuit version of an interface device. The first version and the second version in combination have a sharable interface. Each of the first version and the second version has N lanes. The first version is a primary version and the second version is a secondary version responsive to a shared interface mode. The N lanes of the second version are combined with the N lanes of the first version via the sharable interface for providing 2-by-N lanes of input/output to the first version.

20 Claims, 9 Drawing Sheets

U.S. PATENT DOCUMENTS

| | | | |
|---|---|---|---|
| 7,447,825 B2 * | 11/2008 | Chen | 710/307 |
| 7,480,757 B2 * | 1/2009 | Atherton et al. | 710/313 |
| 2006/0093147 A1 * | 5/2006 | Kwon et al. | 380/268 |
| 2008/0276029 A1 * | 11/2008 | Haraden | 710/305 |

OTHER PUBLICATIONS

U.S. Appl. No. 11/803,521, filed May 14, 2007, Stadler, Laurent Fabris, Hard Macro-to-User Logic Interface, Xilinx, Inc. 2100 Logic Drive, San Jose, Ca 95124.

U.S. Appl. No. 11/803,516, filed May 14, 2007, Kolze, Paige A., et al., Configurable Interface, Xilinx, Inc. 2100 Logic Drive, San Jose, Ca 95124.

U.S. Appl. No. 11/803,522, filed May 14, 2007, Tran, Dai D., et al., Interface Device Reset, Xilinx, Inc. 2100 Logic Drive, San Jose, Ca 95124.

U.S. Appl. No. 11/803,517, filed May 14, 2007, Case, Jerry A., Reconfiguration of a Hard Macro Via Configuration Registers, Xilinx, Inc. 2100 Logic Drive, San Jose, Ca 95124.

* cited by examiner

INTERFACE DEVICE LANE CONFIGURATION

CROSS-REFERENCE TO RELATED APPLICATIONS

This application is related to the following co-pending U.S. patent applications: U.S. patent application entitled "Interface Device Reset," by Dai D. Tran, et al., U.S. patent application entitled "Configurable Interface" by Paige A. Kolze, et al., U.S. patent application entitled "Hard Macro-to-User Logic Interface," by Laurent Stadler, and U.S. patent application entitled "Reconfiguration of a Hard Macro via Configuration Registers," by Jerry A. Case, each of which was filed on the same day as the present application and each of which is assigned to the assignee of the present application. The entire contents of each of the above-referenced co-pending patent applications are incorporated herein by reference for all purposes.

FIELD OF THE INVENTION

One or more aspects of the invention relate generally to integrated circuits, and, more particularly, to lane configuration of an interface device of an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, performance of a design instantiated in programmable logic of an FPGA ("FPGA fabric") using a Peripheral Component Interconnect ("PCI") Express ("PCIe") internal to such FPGA was limited to performance of a PCIe design for instantiation in FPGA fabric ("soft core"). Additional details regarding examples of PCIe soft cores are available from Xilinx, Inc. of San Jose, Calif. and are described in "PCI Express PIPE Endpoint LogiCORE Product Specification," DS321 (v1.1), Apr. 11, 2005 and in "PCI Express Endpoint Cores v3.4 Product Specification," DS506, Feb. 15, 2007, both available from Xilinx, Inc.

PCIe soft cores have been implemented as an "Endpoint" architecture. Target applications for such Endpoint architecture include: test equipment, consumer graphics boards, medical imaging equipment, data communication networks, telecommunication networks, broadband deployments, cross-connects, workstation and mainframe backbones, network interface cards, chip-to-chip and backplane interconnect, crossbar switches, wireless base stations, high bandwidth digital video, and high bandwidth server applications, among other known add-in cards, host bus adapters, and other known applications.

Accordingly, it would be desirable and useful to provide a PCIe Endpoint internal to an FPGA having enhanced performance over that of a PCIe soft core instantiated in FPGA fabric.

SUMMARY OF THE INVENTION

One or more aspects of the invention generally relate to integrated circuits, and, more particularly, to lane configuration of an interface device of an integrated circuit.

An aspect of the invention is an integrated circuit including a core for tiling a portion thereof with a first version of the core and a second version of the core. The core is an application specific circuit version of an interface device. The first version and the second version in combination have a sharable interface. Each of the first version and the second version has N lanes. The first version is a primary version and the second version is a secondary version responsive to a shared interface mode. The N lanes of the second version being combined with the N lanes of the first version via the sharable interface for providing 2-by-N lanes of input/output to the first version.

Another aspect of the invention is a method for lane configuration. A portion of an integrated circuit is tiled by repeated application of a core having N lanes, where the core is an application specific circuit version of an interface device. The core is configurable for either a shared interface mode or a non-shared interface mode. At least two instances of the core are placed in the shared interface mode to provide a shared interface capable of at least 2-by-N lanes.

Yet another aspect of the invention is a programmable logic device including M instances of a core tiled in a column of the programmable logic device. The M instances of the core are associated with a Peripheral Component Interconnect Express ("PCIe") interface. The M instances of the core are capable of being in either a shared interface mode or a non-shared interface mode. Each of the M instances of the core has N lanes. In the shared interface mode, the N lanes of each of the M instances of the core capable of being combined provide an M-by-N version of the PCIe interface. Each of the M instances of the core has dedicated primary and secondary sets of input and output pins for providing shared physical layer-side and transaction layer-side buses. The dedicated primary and secondary sets of input and output pins are located for abutting primary input to secondary output and primary output to secondary input responsive to tiling of the M instances of the core.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
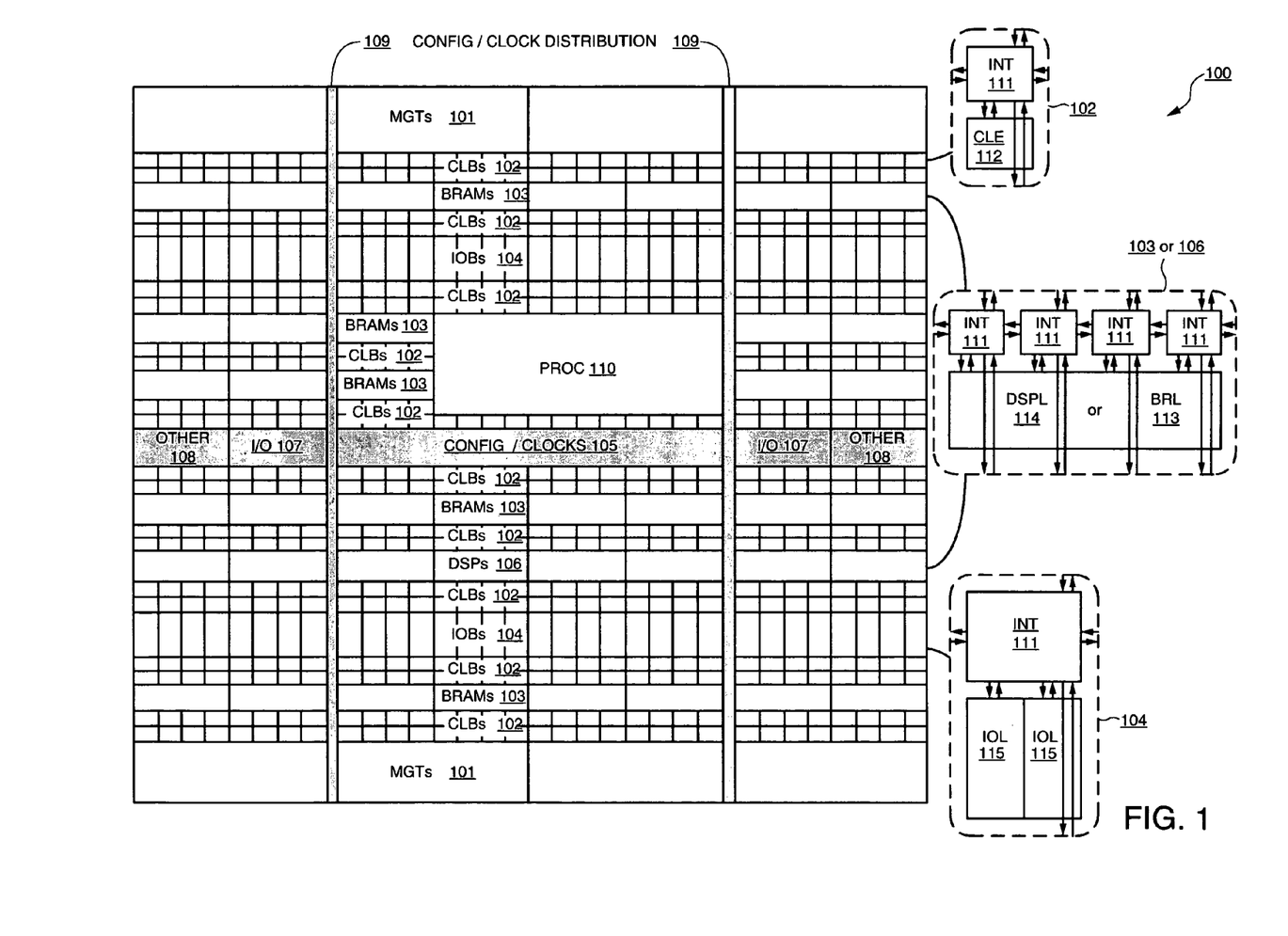
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
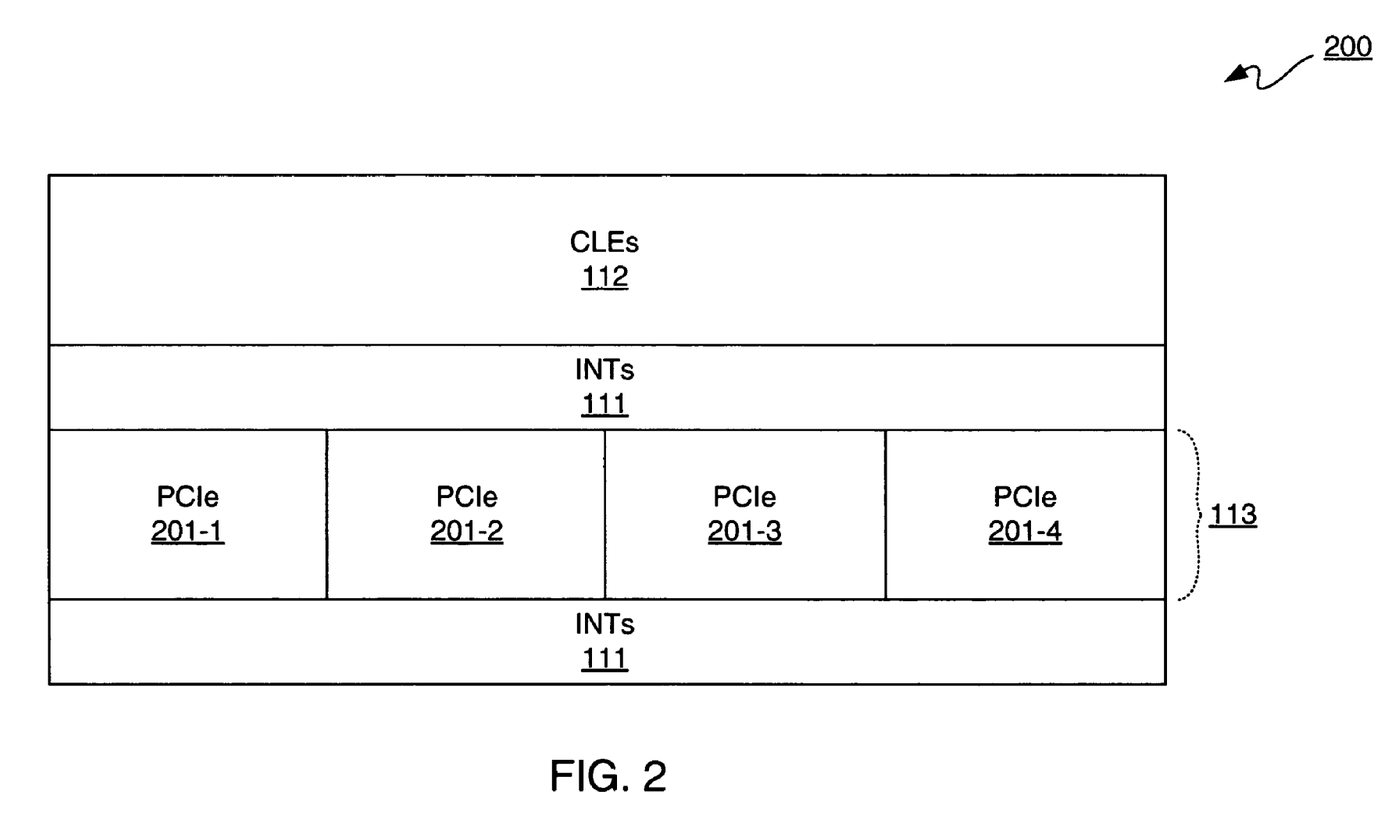
FIG. 2 is a block diagram depicting an exemplary embodiment of a portion of an FPGA with a column of Peripheral Component Interconnect ("PCI") Express ("PCIe") Application Specific Integrated Circuit ("ASIC") cores, namely PCIe hard cores.

FIG. 2 is a block diagram depicting an exemplary embodiment of a portion of an FPGA 200. FPGA 200 may be substantially similar to FPGA 100 of FIG. 1. However, in place of a column of BRLs 113 are located PCIe Application Specific Integrated Circuit ("ASIC") cores, namely PCIe hard cores. Notably, rather than using a column of BRLs 113, other columns in FPGA 100 of FIG. 1 may be used. PCIe hard cores 201-1 through 201-4 are illustratively shown between two columns of INTs 111. Though four PCIe hard cores 201-1 through 201-4 are illustratively shown, fewer or more than four PCIe hard cores may be implemented in an FPGA.

Figure 3:
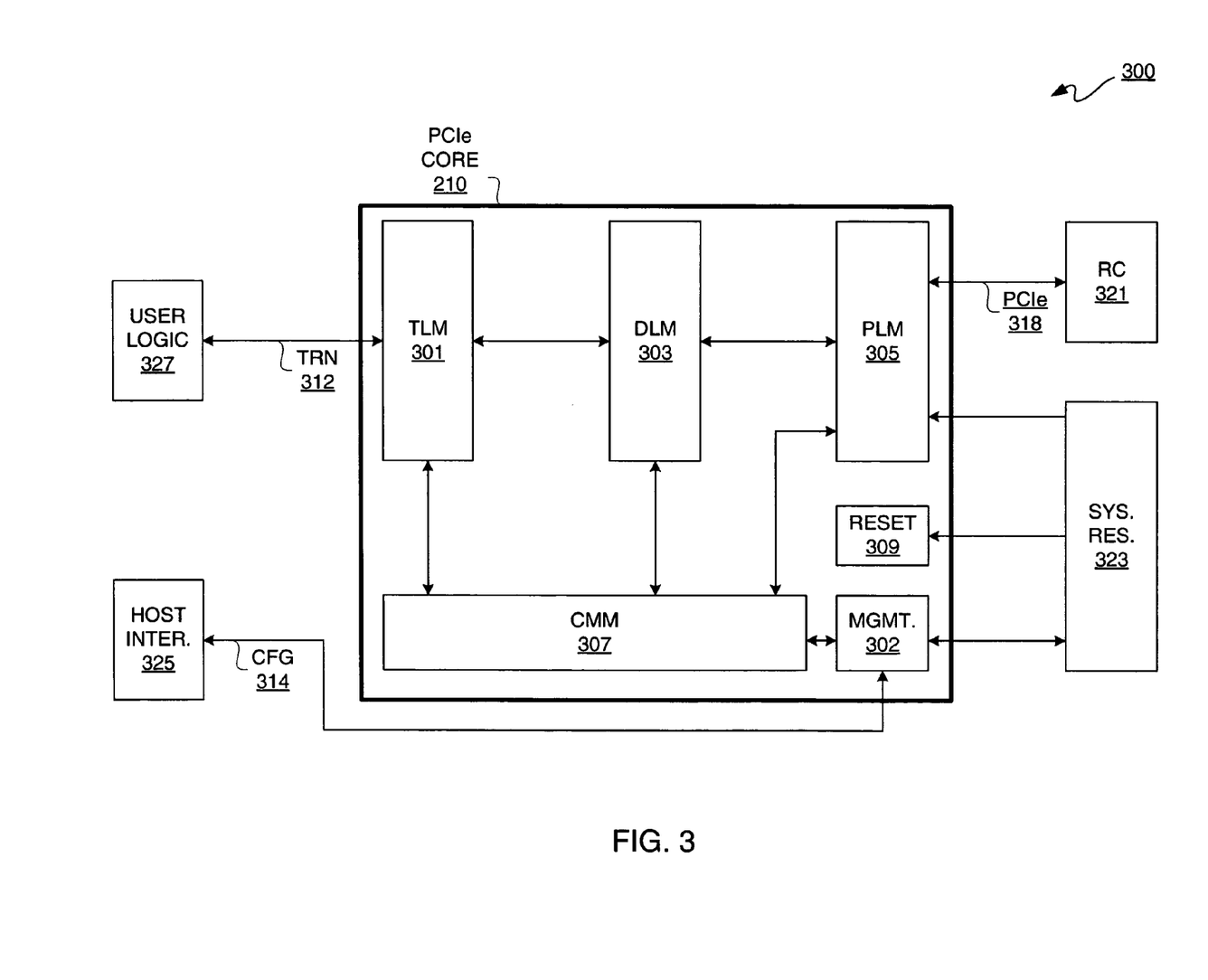
FIG. 3 is a block diagram depicting an exemplary embodiment of a PCIe system.

FIG. 3 is a block diagram depicting an exemplary embodiment of PCIe system 300. PCIe system 300 may be implemented in an FPGA. PCIe system 300 includes a PCIe hard core ("PCIe core") 210, which may be a PCIe hard core of PCIe hard cores 201-1 through 201-4 of FIG. 2, coupled to a Root Complex 321, user logic 327, host interface 325, and system resources 323. PCIe core 210 includes a physical layer module ("PLM") 305, a datalink layer module ("DLM") 303, a transaction layer module ("TLM") 301, a configuration management module ("CMM") 307, a management block 302, and a reset block 309.

Within PCIe core 210, TLM 301 is coupled to DLM 303 for bidirectional communication, and DLM 303 is coupled to PLM 305 for bidirectional communication. Additionally, each of TLM 301, DLM 303, and PLM 305 is coupled to CMM 307 for bidirectional communication. Reset block 309 is coupled to TLM 301, DLM 303, PLM 305, CMM 307, and management block 302, though not illustratively shown in FIG. 3 for purposes of clarity. Management block 302 is coupled via a read/write interface to CMM 307.

PLM 305 is coupled to Root Complex 321 via PCIe interface 318. Additionally, PLM 305 may be coupled to system resources 323 for receiving a clock signal. Reset block 309 may be coupled to system resources 323 for receiving reset signaling. Management block 302 may be coupled to system resources 323 for dynamic configuration and status monitoring. Configuration interface 314 may couple host interface 325 to management block 302, and host interface 325 may thus be coupled to CMM 307 via configuration interface 314 and management block 302. User logic 327, which may be instantiated in FPGA fabric, is coupled to TLM 301 via transaction interface 312.

With continuing reference to FIG. 3, it should be understood that a PCIe core 210 may be what is known as an "Endpoint." Examples of applications of PCIe Endpoints include graphics cards, memory cards, and the like. In this example, a PCIe core 210 is implemented in an FPGA as an ASIC. However, user logic 327 may be configured for an application implemented with FPGA resources which would interface to such PCIe core 210. Additionally, multiple PCIe cores 210 may be coupled to a Root Complex 321 to provide a PCIe network, an example of which is described in additional detail with reference to FIG. 4 below.

Host interface 325 may be an interface to a processor of a processor block 110 of FIG. 1, namely an embedded processor, or may be a host interface to another type of host. Examples of other types of hosts include a microprocessor instantiated in FPGA fabric, such as a MicroBlaze microprocessor available from Xilinx, Inc. of San Jose, Calif. Another example of a host may be a sequencer instantiated in FPGA fabric, or other known host device that may be instantiated in FPGA fabric.

Figure 4:
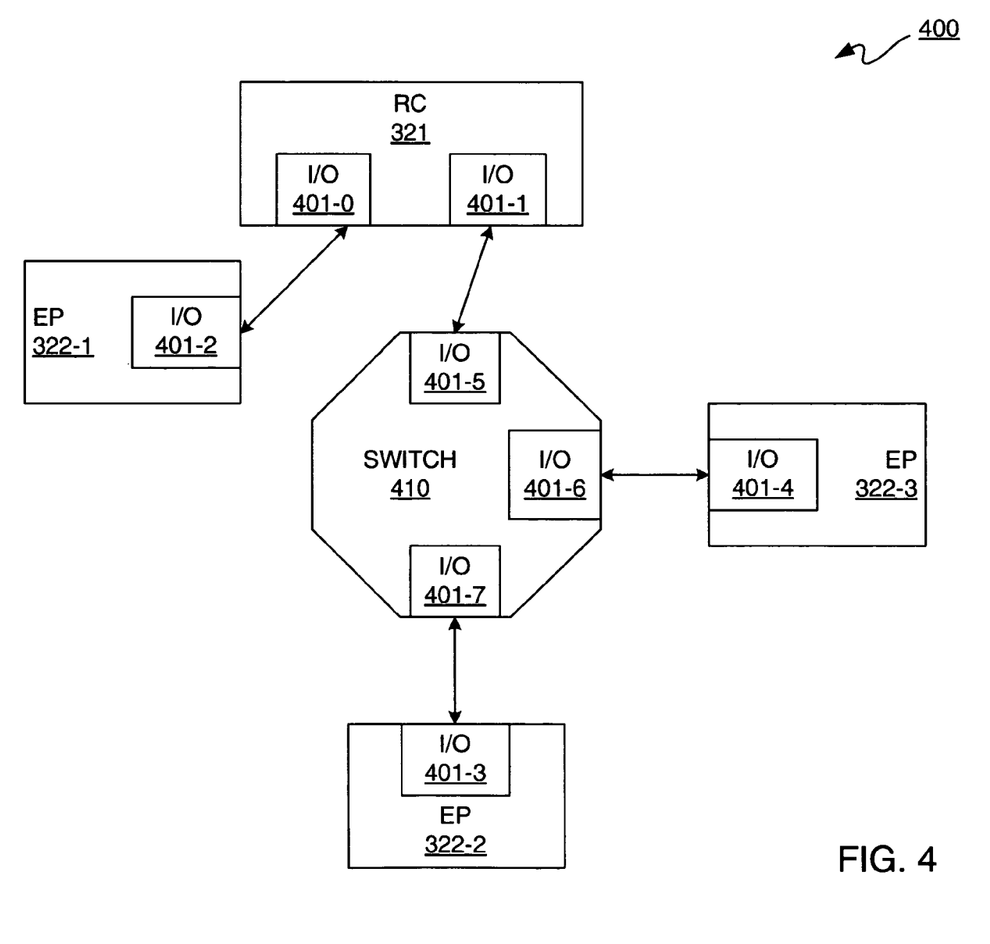
FIG. 4 is a network diagram depicting an exemplary embodiment of a PCIe network.

FIG. 4 is a network diagram depicting an exemplary embodiment of a PCIe network 400. PCIe network 400 includes Root Complex ("RC") 321, and Endpoints ("EPs") 322-1 through 322-3. Although a Root Complex 321 and three Endpoints 322-1 through 322-3 are illustratively shown, it should be appreciated that fewer or more of each may be implemented. PCIe network 400 may be implemented on a single FPGA, where switch matrix 410 is implemented using programmable interconnects, among other details described below.

Root complex 321 includes I/O blocks 401-0 and 401-1; I/O block 401-0 is directly coupled to I/O block 401-2 of Endpoint 322-1. With reference to FPGA 100 of FIG. 1, I/O blocks 401-0 through 401-2 for example may be implemented using I/O 107 or MGTs 101 of FIG. 1. Moreover, I/O blocks 401-0 through and 401-2 for example may be implemented using one or more IOBs 104 of FIG. 1. Root Complex 321 is coupled to Endpoints 322-2 and 322-3 via switch matrix 410. Switch matrix 410 may be implemented as a known PCIe switch block. Accordingly, switch matrix 410 may include I/O blocks 401-5 through 401-7 for respectively coupling to I/O blocks 401-1, 401-4, and 401-3, where I/O blocks 401-3 and 401-4 are respectively of Endpoints 322-2 and 322-3.

Having this understanding of a PCIe network 400, and a PCIe hard core 210 of FIG. 3, both of which may be implemented in an FPGA, a detailed description of lane configuration is provided.

Figure 5A:
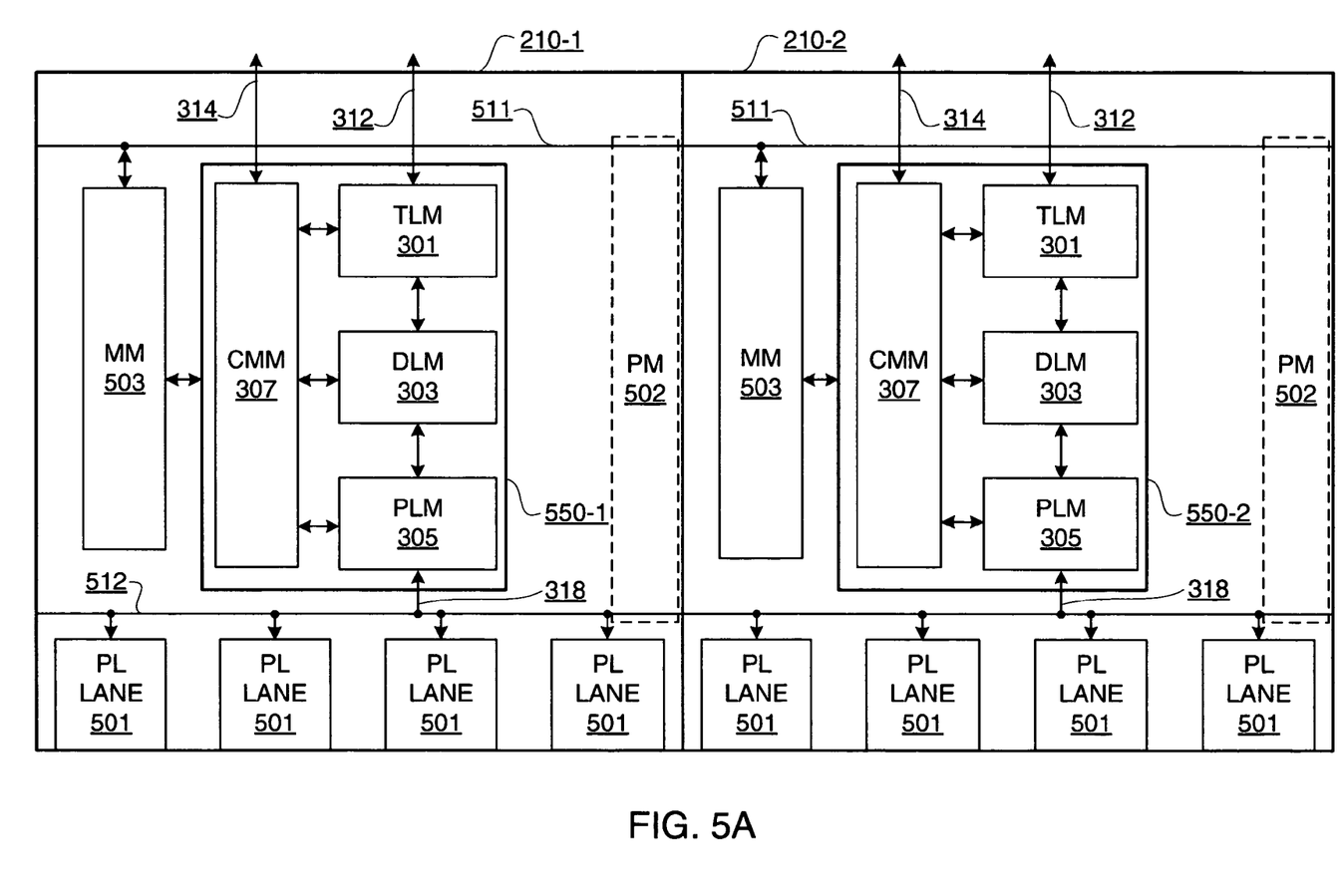
FIG. 5A is a block diagram depicting an exemplary embodiment of two PCIe hard cores, such as the PCIe hard cores of FIG. 2, abutting one another after tiling.

FIG. 5A is a block diagram depicting an exemplary embodiment of PCIe cores 210-1 and 210-2 abutting one another after tiling, as illustratively shown in FIG. 2 with respect to PCIe cores 201-1 through 201-4. Notably, blocks 302 and 309 of PCIe core 210 of FIG. 3 are not illustratively shown in FIG. 5A for purposes of clarity. In this exemplary embodiment, a single core design is used to tile at least a portion of a column of an FPGA, such as FPGA 200 of FIG. 2, with PCIe cores 210-1 and 210-2, which for example may be PCIe cores 201-1 and 201-2, respectively, of FIG. 2. From the description that follows, it should be appreciated that the core design used therefore may be identical for each core instance, such as PCIe cores 201-1 through 201-4 of FIG. 2. By having cores which are repetitions of the same circuit, and which may be essentially physically identical, a reduction in implementation overhead, including physical layout, may be facilitated. Additionally, because such cores are essentially the same, common functional and timing models may be used.

With continuing reference to FIG. 5, PCIe cores 210-1 and 210-2 may be implemented such that only one shared interface is used. In the example of having a shared interface, PCIe cores 210-1 and 210-2 may be physically identical; however, one of such cores will be flipped for purposes of coupling to the other core to provide a shared interface. In other words, the physical layout of one of the cores may be inverted, and but for such inversion, the physical layouts of both cores would be the same. However, for purposes of clarity by way of illustration, for now it shall be assumed that each PCIe core 210-1 and 210-2 has the same physical layout without such flipping or mirroring. It should be noted that in a shared mode, PCIe core 210-1 may be a primary ("P") core and PCIe core 210-2 may be a secondary ("S") core, as described below in additional detail. Moreover, by reversing the P and S designations, PCIe core 210-1 may be a secondary core and PCIe core 210-2 may be a primary core, as shall become more apparent from the following description.

Each PCIe core 210-1 and 210-2 includes four physical layer ("PL") lanes 501. Physical layer lanes 501 may be coupled to respective MGTs 101, for example, of FPGA 100 of FIG. 1 (not shown in FIG. 5A). Alternatively, IOBs 104 or I/Os 107 may be used instead of MGTs 101. Physical layer lanes 501 of PCIe cores 210-1 and 210-2 are coupled to a bus which is in turn coupled to respective PLMs 305 of PCIe cores 210-1 and 210-2, namely "physical layer-side bus" 512. Notably, separate lines are used for coupling physical layer-side bus 512 to each physical layer lane 501 of PCIe cores 210-1 and 210-2. PLMs 305 of PCIe cores 210-1 and 210-2 are coupled to physical layer-side bus 512 via respective PCIe interfaces 318.

On a transaction layer side, PCIe cores 210-1 and 210-2 are coupled to a "transaction layer-side bus" 511. Transaction layer-side bus 511 is coupled to memory modules 503 respectively of such cores. Memory modules 503 may be coupled to respective CMMs 307, TLMs 301, DLMs 303, and PLMs 305 of such cores via a known memory busing architecture; such coupling is not illustratively shown in FIG. 5A for purposes of clarity.

Each PCIe core 210-1 and 210-2 may include a respective pipeline module 502. One or more pipeline modules 502 need not be used in each application of PCIe cores 210-1 and 210-2, and thus may be optioned in as indicated by dashed lines.

In FIG. 5A, if PCIe cores 210-1 and 210-2 are each configured for a shared interface mode, then physical layer lanes 501 of one of such cores which acts a secondary core are used by another of such cores which acts as a primary core. For example, assuming PCIe core 210-1 is configured to be a primary core for a shared interface mode, and PCIe core 210-2 is configured to be a secondary core for such shared interface mode, then traffic communicated via physical layer lanes 501 of PCIe core 210-2 travels through a datapath associated with modules 550-1 of PCIe core 210-1, and does not travel through a datapath associated with modules 550-2 of PCIe core 210-2. Notably, modules 550-1 include TLM 301, DLM 303, PLM 305, and CMM 307 of PCIe core 210-1 and modules 550-2 include TLM 301, DLM 303, PLM 305, and CMM 307 of PCIe core 210-2. Thus, PCIe core 210-1 for this particular example may be configured as an interface with eight physical layer lanes 501. Accordingly, input traffic or output traffic for such PCIe interface provided via PCIe core 210-1 may be aggregated at PCIe core 210-1, even though such traffic may travel via physical layer lanes 501 of PCIe core 210-2.

Physical layer lanes 501 may operate at a lane clock frequency, which for PCIe may be approximately 250 MHz. PCIe interface 318 thus would operate at a lane clock frequency. Modules 550-1 and 550-2 may operate at a link clock rate or core clock rate, which may be the same or different. However, for PCIe a link clock rate and a core clock rate may both be approximately 250 MHz. Memory modules 503 may operate at either a link clock rate or core clock rate, which for PCIe is approximately 250 MHz, or a user clock rate, such as approximately 250, 125, or 62.5 MHz, for example. Notably, portions of TLM 301 and CMM 307 may include a user clock domain operating at a user clock rate. Transaction interface 312 and configuration interface 314 may likewise be operating at the user clock rate.

In an implementation using a Xilinx FPGA, MGTs 101 of FIG. 1 which are configured to communicate eight bits or one byte at a time, may be used for providing a physical interface ("PHY"). Thus, each physical layer lane 501 may be configured for handling one byte of information at a time. Each physical layer lane 501, or PLM 305, looks for a particular sequence in each byte in accordance with a PCIe protocol. This sequence of bits in each byte represents bits of a training sequence of bytes. Thus, each physical layer lane 501 may individually look for such training bits and, responsive to identifying such training bits, may pass them to PLM 305 of PCIe core 210-1 responsive to PCIe cores 210-1 and 210-2 each being in a shared interface mode and PCIe core 21001 functioning as the primary core. Notably, for a full use of all bits, such as 64 for this example, frequency of modules 550-1 may be approximately 250 MHz for an eight-lane PCIe interface. If, however, only one physical layer lane 501 was used for providing a PCIe interface, then such physical layer lane 501 in use may be cycled eight times for loading all 64 bits for a 64-bit wide datapath associated with modules 550-1. Accordingly, modules 550-1 in such a configuration may be operated at one eighth the lane clock rate, namely one eighth of approximately 250 MHz. If, for example, two physical layer lanes 501 were used to provide a PCIe interface, then a clock frequency of one quarter of the lane clock rate may be used for modules 550-1. Furthermore, if four physical layer lanes 501 were used, then a clock frequency of one half the lane clock rate may be used for modules 550-1. In other words, if all 64 bits are not used, then some number of clock cycles may be used to fill all 64 bits. Accordingly, data may be buffered until all 64 bits are filled, and such buffering may be in buffers (not shown) of an associated PLM for example.

Thus, modules 550-1 and 550-2 in this example are configured for 64-bit processing, as are memory modules 503. Furthermore, all interfaces on a transaction layer side are configured for a data bit width of 64 bits. Whether a one-lane, two-lane, four-lane, or eight-lane PCIe interface is to be implemented, configuration registers (not shown) of CMMs 307 of PCIe cores 210-1 and 210-2, for example, are set in advance to configure a PCIe interface. Notably, for a sixteen-lane PCIe interface, two groups of two PCIe cores 210-1 and 210-2 may be implemented, such as PCIe cores 201-1 through 201-4 of FIG. 2. However, it should be appreciated that in such a configuration, two 64-bit halves of information are concatenated to provide the 128-bit width.

Figure 5B:
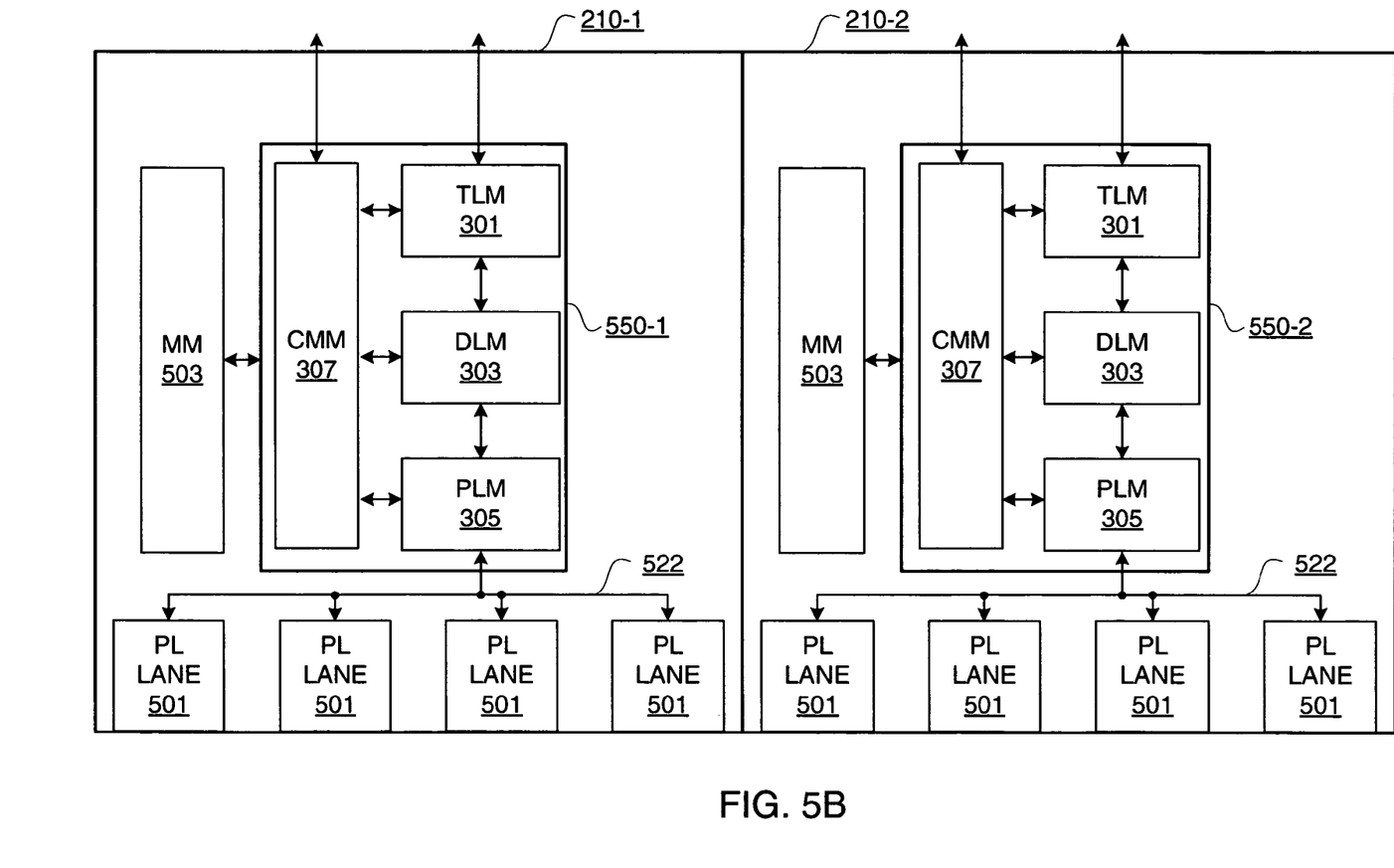
FIG. 5B is a block diagram depicting an exemplary embodiment of effective busing of the two PCIe hard cores of FIG. 5A when in a non-shared interface mode.

Another mode in which PCIe cores 210-1 and 210-2 may be implemented is a non-shared interface mode. FIG. 5B is a block diagram depicting an exemplary embodiment of busing of PCIe cores 210-1 and 210-2 when in a non-shared interface mode. Notably, unused physical connections for a non-shared interface mode are still present, but are not illustratively shown in FIG. 5B for reasons of clarity. For example, although memory modules 503 are coupled to transaction layer-side bus 511 of FIG. 5A, because such transaction layer-side bus 511 is not used, it is not illustratively shown in FIG. 5B for a non-shared interface mode. Furthermore, even though a shared physical layer-side bus 512 is still present, as illustratively shown in FIG. 5A, it is not used as such in a non-shared interface mode and thus is shown as two separate physical layer-side buses 522 respectively of PCIe cores 210-1 and 210-2.

Thus, it should be appreciated that while all 64 bits may be processed at a time through a PCIe core 210-1, for example, this usage may result from buffering bits over multiple clock cycles in a non-shared interface mode or may result from aggregating 64 bits at a time each clock cycle by using shared interface circuitry. When in a shared interface mode, as described above where PCIe core 210-1 is a primary core and PCIe core 210-2 is a secondary core, modules 550-2 and memory module 503 of PCIe core 210-2 and associated interfaces are not used.

Figure 6:
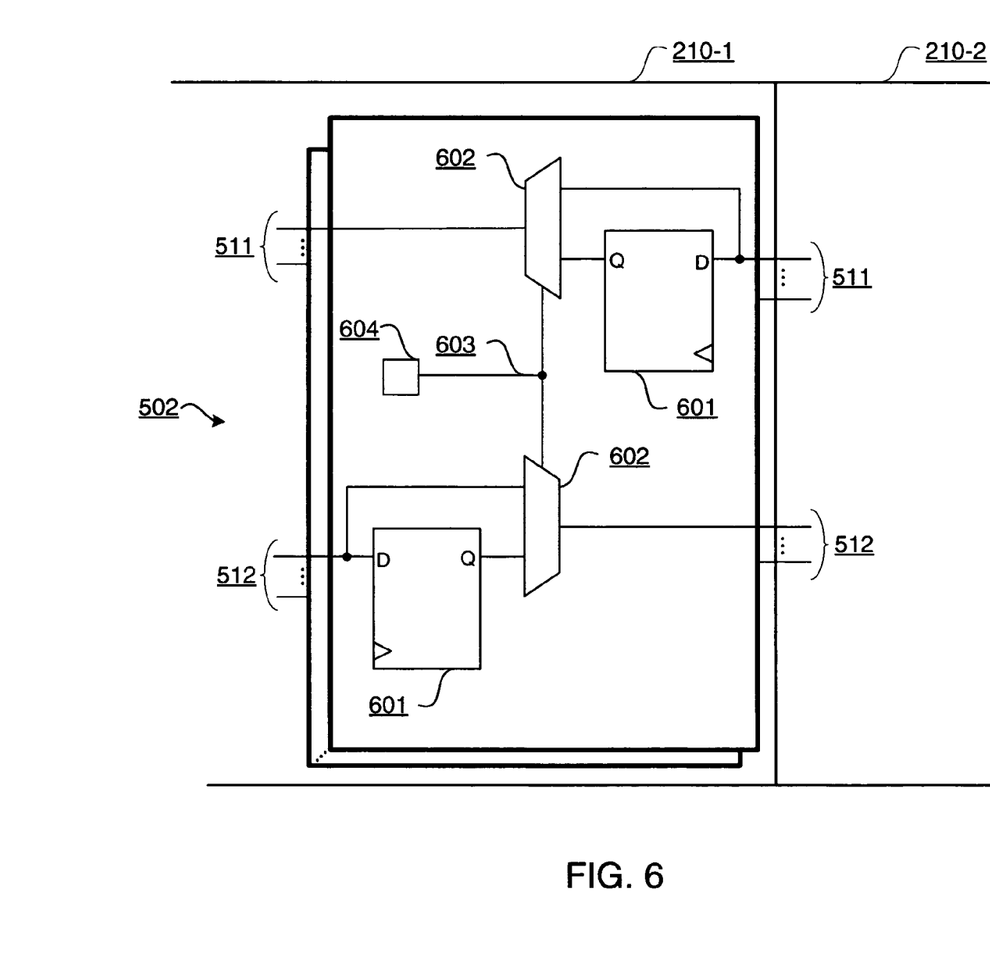
FIG. 6 is a circuit/block diagram depicting an exemplary embodiment of a pipeline module, such as may be optioned into a PCIe hard core of FIG. 5A.

FIG. 6 is a circuit/block diagram depicting an exemplary embodiment of a pipeline module 502. Pipeline module 502 may be used for coupling hard cores together to register information prior to passing between such coupled hard cores. Pipeline module 502 includes flip-flops 601 and multiplexers 602. Notably, as there may be multiple lines associated with physical layer-side bus 512 and transaction layer-side bus 511, there may be multiple circuits optioned in from a single configuration memory cell 604 state to provide a single select signal 603 as a control select input to each multiplexer 602. Thus, there may be an instance of a pipeline module for each pair of input/output and output/input bus traces coupling PCIe cores 210-1 and 210-2. Via a transaction layer-side bus 511 or a physical layer-side bus 512, data is provided to an input port of a respective flip-flop 601 and to a respective data input port of a respective multiplexer 602. Outputs of respective flip-flops 601 are provided to input ports of respective multiplexers 602. Control select signal 603 selects between whether registered or unregistered data passes via multiplexers 602. In this example, pipeline module 502 is illustratively shown for PCIe core 210-1. However, it should be appreciated that PCIe core 210-2 may have an equivalent pipeline module 502.

Figure 7:
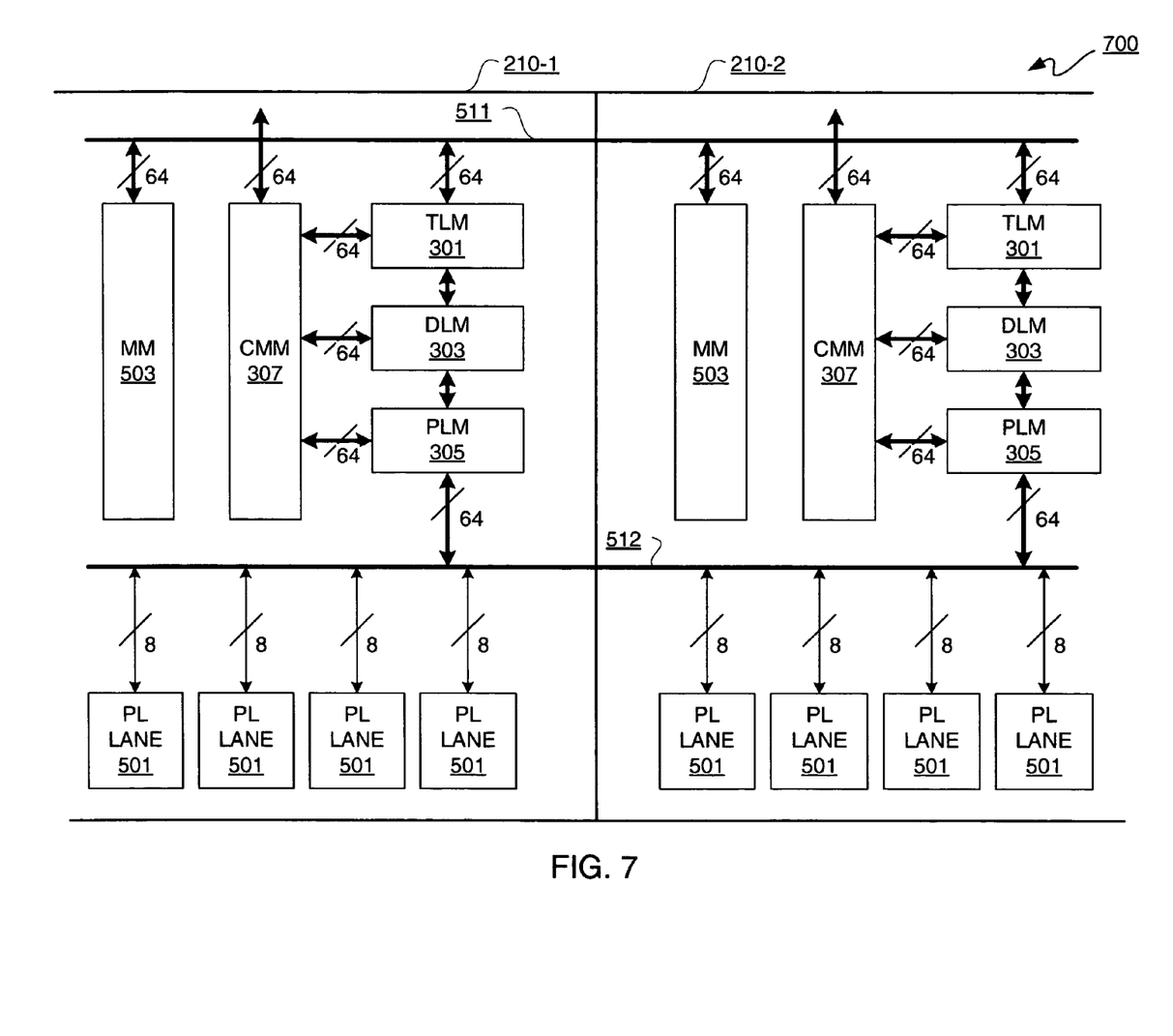
FIG. 7 is the block diagram of FIG. 5A for an exemplary embodiment of an eight lane configuration with reference to one-byte bit widths of each physical layer lane and four physical layer lanes for each PCIe hard core.

FIG. 7 is the block diagram of FIG. 5A for an exemplary embodiment of an eight lane configuration 700 as described above with reference to one-byte bit widths of each physical layer lane 501 and four physical layer lanes 501 for each PCIe core 210-1 and 210-2. Notably, again, reset block 309 and management block 302 are not illustratively shown for purposes of clarity and not limitation. Additionally, interfacing between memory modules 503 and other modules of each PCIe core 210-1 and 210-2, respectively, is not illustratively shown for purposes of clarity and not limitation. It should be appreciated that modules 301, 303, 305, 307, and 503 of each PCIe core 210-1 and 210-2 operate using a 64-bit width, and each physical layer lane 501 uses an 8-bit width. Thus, buses 511 and 512 may each have a capability of using 64 bits, where 32 pins are local to each such PCIe core 210-1 and 210-2 and 32 pins, as well as associated lines, are available for sharing. As it has been assumed that each of PCIe cores 210-1 and 210-2 is symmetrical, it should be appreciated that the local lines to each such core are associated with pins for providing a shared interface in each of such PCIe cores 210-1 and 210-2.

Figure 8:
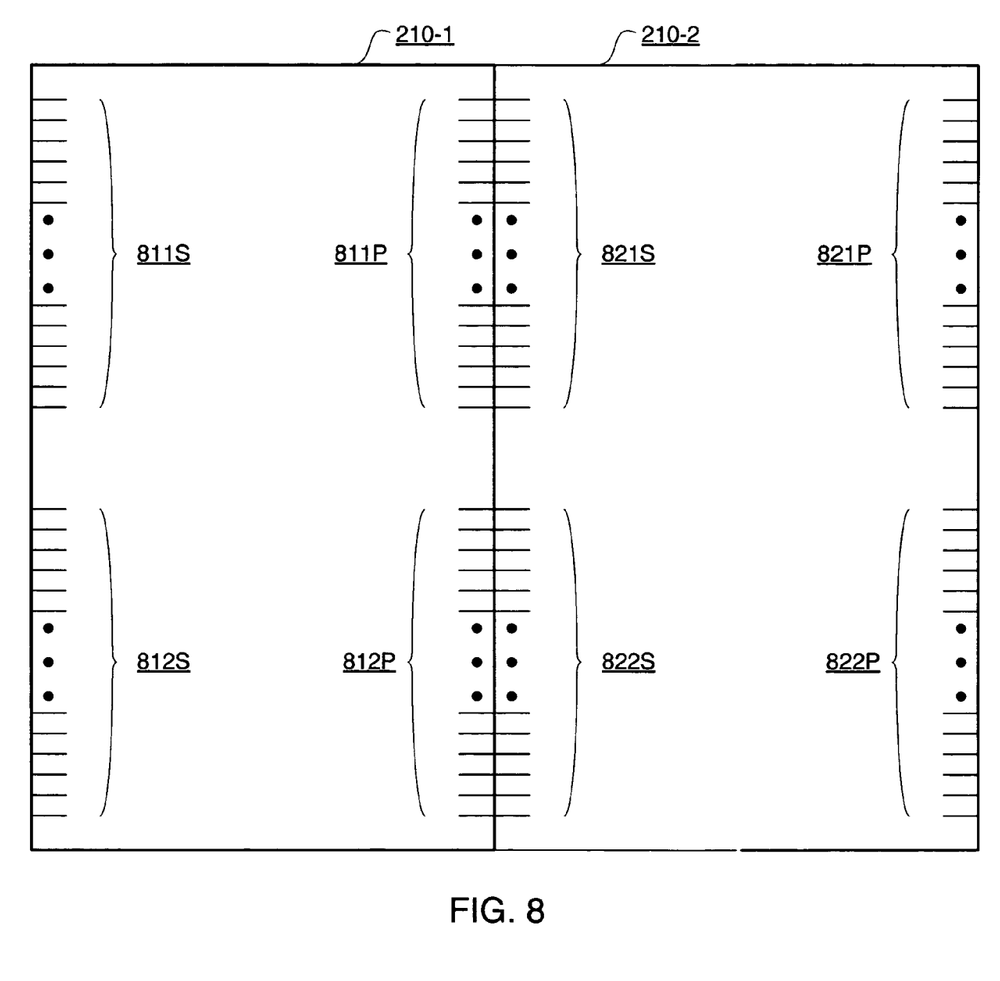
FIG. 8 is a port diagram depicting an exemplary embodiment of ports associated with transaction layer-side and physical layer-side busing for the PCIe hard cores of FIGS. 5A and 7.

FIG. 8 is a port diagram depicting an exemplary embodiment of ports associated with transaction layer-side and physical layer-side busing for PCIe cores 210-1 and 210-2. PCIe core 210-1 includes sets of dedicated pins 811P, 811S, 812P, and 812S. Set of pins 811P is associated with an input port for when PCIe core 210-1 is a primary core, and set of pins 812P is associated with an output port for when PCIe core 210-1 is a primary core. Notably, the ports associated with sets of pins 811P and 812P exist whether or not PCIe core 210-1 is selected as a primary core or not; however, the use of such pins only applies when PCIe core 210-1 is used as a primary core.

PCIe core 210-1 includes sets of pins 811S and 812S. Set of pins 811S is associated with an output port for when PCIe core 210-1 is configured as a secondary core. Set of pins 812S is associated with an input port for when PCIe core 210-1 is configured as a secondary core. Notably, ports associated with sets of pins 811P, 811S, 812P, and 812S are only used when PCIe core 210-1 is operating in a shared interface mode. Moreover, sets of pins 811S and 812S exist but are not used unless PCIe core 210-1 is configured to be in a shared interface mode and is configured to operate as a secondary core, and likewise, sets of pins 811P and 812P exist but are not used unless PCIe core 210-1 is configured to be in a shared interface mode and is configured to operate as a primary core.

Likewise, PCIe core 210-2 includes sets of points 821P, 821S, 822P, and 822S. Sets of pins 821S and 822S correspond to sets of pins 811S and 812S, and are used in a like manner, though for PCIe core 210-2. Furthermore, sets of pins 821P and 822P correspond to respective sets of pins 811P and 812P, and likewise are used as previously described, though for PCIe core 210-2. In other words, if PCIe core 210-2 is configured to be a secondary core in a shared interface mode, then sets of pins 821S and 822S are used, and if PCIe core 210-2 is configured to be used as a primary core in a shared interface mode, then sets of pins 821P and 822P are used.

Continuing the above example of a shared interface using physical layer-side bus 512 and transaction layer-side bus 511 of FIG. 5A, though such buses are not illustratively shown in FIG. 8, sets of pins 812P are coupled to sets of pins 822S, and sets of pins 811P are coupled to sets of pins 821S. Notably, sets of pins 821S and 811P correspond to transaction layer-side bus 511, and sets of pins 822S and 812P correspond to physical layer-side bus 512. Thus, each set of pins 811S, 811P, 812S, 812P, 821S, 821P, 822S, and 822P has 32 pins. Furthermore, it should be appreciated that sets of pins 812S and 822S correspond to PCIe core busing of physical layer lanes 501 respectively of PCIe cores 210-1 and 210-2 for sharing. Thus, set of pins 812S goes to a PLM 305 of PCIe core 210-1 and a neighboring PCIe core, if any, to the left of PCIe core 210-1 (not shown), and set of pins 822S goes to a PLM 305 of each of PCIe cores 210-1 and 210-2. In contrast, set of pins 812P corresponds to signal lines only going to PLM 305 of PCIe core 210-1, and set of pins 822P corresponds to signal lines only going to PLM 305 of PCIe core 210-2. Notably, for purposes of clarity by way of example and not limitation, a data busing portion is described. However, for a PCIe implementation, each physical layer for example may have more than just an associated data portion. These other signals follow from the transport protocol associated with a PCIe implementation, and thus are not described in unnecessary detail for purposes of clarity.

Transaction layer-side bus 511, continuing the above example, is a 64-bit wide bus. Accordingly, set of pins 811S is associated with signal lines local to PCIe core 210-1 and may be shared with another PCIe core (not shown). Set of pins 811P is associated with coupling signal lines associated with set of pins 821S of PCIe core 210-2 to memory module 503 of PCIe 210-1.

Thus, it should be appreciated that buses 511 and 512 may be formed by serially coupling signal line traces of PCIe cores, primary ("P") to secondary ("S"), and vice versa. Additionally, it should be noted that sets of pins 811S, 811P, 812S, and 812P, as well as 821S, 821P, 822S, and 822P, may be located on the periphery of their respective PCIe cores 210-1 and 210-2. By having pins on the periphery, it should be appreciated that sets of corresponding pins may abut one another responsive to tiling of PCIe cores.

Thus, it should be appreciated that M PCIe cores for M an integer equal to or greater than 2, which in this embodiment are hard cores, may have a same circuit layout such that they are essentially physically the same. Such PCIe cores may therefore be tiled to provide a PCIe interface of M by N lanes, where N is the number of physical layer lanes of each PCIe core. Notably, N equal to 4 and M equal to 2, as illustratively shown in FIGS. 5A and 7, are merely examples, and N equal to some number other than 4 such as 1, 2, or 8 may be used. Moreover, M may equal a number greater than 2. Furthermore, it should be appreciated that by having dedicated pins disposed about a periphery of such hard cores, a shared signal interface may be facilitated by having such pins abut one another in association with complementary ports.

The implementation of M cores that may be operated either in a shared interface mode, or independently, provides design flexibility not available with a single core having a fixed M by N lane interface. This flexibility is enhanced by the flexibility associated with an FPGA, where a user may have different sets of user logic interfacing to such PCIe cores. Furthermore, because the number of lanes for each PCIe core may be a subset of the total number of lanes which may be provided via coupling multiple PCIe cores together, a finer granularity may be achieved in comparison to a single PCIe interface block having a fixed M by N lane protocol. For example, if only one lane were to be used, then a substantial amount of circuitry of such a single PCIe interface block having a fixed M by N block implementation would be wasted, in comparison to having PCIe cores that may be flexibly concatenated as described herein. Furthermore, the effective pin count may be reduced by using the finer granularity of individual PCIe cores whether or not they are used in a shared interface mode.

Notably, PCIe cores need not be physically identical but may have similar designs. Thus, they may have a shared interface on only one side, where such cores have complementary ports as previously described for example with reference to FIG. 8. Furthermore, a design may be physically identical and have only one shared interface, provided one of such cores may be flipped for coupling to the other core. These are examples in addition to the example of having shared interfaces on two sides of each core which are the same. Furthermore, while the above example of a PCIe interface has been used, it should be appreciated that other networking protocols may be used, including for example Fibre-Channel, Serial Rapid IO, and HyperTransport, among other known networking protocols.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
    a core for tiling a portion of the integrated circuit with a first version of the core and a second version of the core, the core being an application specific circuit version of an interface device;
    the first version and the second version in combination having a sharable physical interface;
    each of the first version and the second version having N lanes;
    the N lanes coupled to a same physical layer-side bus of the sharable physical interface;
    the first version of the core and the second version of the core each having a physical layer module coupled to the same physical layer-side bus;
    the first version being a primary version and the second version being a secondary version responsive to a shared interface mode; and
    the N lanes of the second version and the N lanes of the first version are available to the first version of the core via the physical layer-side bus of the sharable physical interface, wherein the N lanes of the second version and the N lanes of the first version provide a 2-by-N lane physical layer interface to the first version in the shared interface mode.

2. The integrated circuit according to claim 1, wherein the interface device is a Peripheral Component Interconnect Express ("PCIe") endpoint.

3. The integrated circuit according to claim 2, wherein each of the first version and the second version are configurable to be in a non-shared interface mode; and
    wherein in the non-shared interface mode, the N lanes of the second version are not combined with the N lanes of the first version via the sharable physical interface for providing two separate N-lane input/output cores.

4. The integrated circuit according to claim 2, wherein the portion of the integrated circuit is at least a portion of a column of a programmable logic device.

5. The integrated circuit according to claim 4, wherein the first version and the second version are instanced in the programmable logic device as respective hard cores; and
    wherein the first version and the second version have a same circuit layout.

6. The integrated circuit according to claim 1, wherein the sharable physical interface is provided with dedicated pins of each of the first version and the second version.

7. The integrated circuit according to claim 6, wherein the dedicated pins of each of the first version and the second version abut one another for coupling lines to provide the sharable physical interface.

8. The integrated circuit according to claim 1, wherein the first version and the second version each have a primary output set of pins and a secondary input set of pins, the primary output set of pins of the first version being for coupling to the secondary input set of pins of the second version for coupling first lines to provide the sharable physical interface.

9. The integrated circuit according to claim 8, wherein the first version and the second version each have a primary input set of pins and a secondary output set of pins, the primary input set of pins of the first version being for coupling to the secondary output set of pins of the second version for coupling second lines to provide the sharable physical interface.

10. The integrated circuit according to claim 9, wherein the first lines are associated with the physical layer-side bus; and
    wherein the second lines are associated with a transaction layer-side bus.

11. The integrated circuit according to claim 10, wherein the primary output set of pins and the primary input set of pins of the second version of the core respectively are unused and tied off; and
    wherein the secondary output set of pins and the secondary input set of pins of the first version of the core respectively are unused and tied off.

12. The integrated circuit according to claim 1, further comprising:
    a first pipeline module of the first version;
    a second pipeline module of the second version; and
    the first pipeline module and the second pipeline module each being optioned-in modules responsive to user selection.

13. The integrated circuit according to claim 12, wherein the first pipeline module is optioned into the sharable physical interface for coupling the first version and the second version together.

14. The integrated circuit according to claim 13, wherein the sharable physical interface includes a transaction layer-side bus, portions of the physical layer-side bus respectively of the first version and the second version being coupled to one another via a first portion of the first pipeline module, and portions of the transaction layer-side bus respectively of the first version and the second version being coupled to one another via a second portion of the first pipeline module.

15. A method for lane configuration, comprising:
    tiling a portion of an integrated circuit by repeated application of a core having N lanes, the core being an application specific circuit version of an interface device;
    the core configurable for either a shared interface mode or a non-shared interface mode;
    placing at least two instances of the core in the shared interface mode to provide a shared physical interface capable of at least 2-by-N lanes, wherein N lanes of each of the two instances of the core provide a 2-by-N lane physical layer interface for an instance of the at least two instances of the core;
    the N lanes of each of the at least two instances of the core coupled to a same physical layer-side bus of the shared physical interface in both the shared interface mode and the non-shared interface mode; and
    each of the at least two instances of the core having a physical layer module coupled to the same physical layer-side bus.

16. The method according to claim 15, wherein the tiling is in a column of a columnar architected Field Programmable Gate Array;
    wherein the interface device is a Peripheral Component Interconnect Express ("PCIe") interface device; and wherein in the non-shared interface mode, the N lanes of each of the at least two instances of the core are not combined when all of the at least two instances of the core are in the non-shared interface mode.

17. The method according to claim 15, wherein the at least two instances of the core each have a primary output set of pins and a secondary input set of pins, the primary output set of pins of an instance of the at least two instances of the core being for coupling to the secondary input set of pins of another instance of the at least two instances of the core for coupling first lines to provide the shared physical interface; and wherein the at least two instances of the core each have a primary input set of pins and a secondary output set of pins, the primary input set of pins of the instance of the at least two instances of the core being for coupling to the secondary output set of pins of the other instance of the at least two instances of the core for coupling second lines to provide the shared physical interface.

18. The method according to claim 17, wherein the first lines are associated with the physical layer-side bus; and wherein the second lines are associated with a transaction-layer-side bus.

19. The method according to claim 18, further comprising optioning in a pipeline module of an instance of the at least two instances of the core for coupling respective portions of the physical layer-side bus of the at least two instances of the core to one another and for coupling respective portions of the transaction layer-side bus of the at least two instances of the core to one another.

20. An integrated circuit, comprising:

M instances of a core tiled in a column of the integrated circuit, the M instances of the core associated with a Peripheral Component Interconnect Express ("PCIe") interface;

the M instances of the core capable of being in either a shared interface mode or a non-shared interface mode;

each of the M instances of the core having N lanes;

in the shared interface mode, the N lanes of each of the M instances of the core capable of being combined to provide an M-by-N version of the PCIe interface;

each of the M instances of the core having dedicated primary and secondary sets of input and output pins for providing shared physical layer-side and transaction layer-side buses;

the N lanes of each of the M instances of the core coupled to a same physical layer-side bus of the shared physical layer-side and transaction layer-side buses in both the shared interface mode and the non-shared interface mode;

each of the M instances of the core having a physical layer module coupled to the same physical layer-side bus; and the dedicated primary and secondary sets of input and output pins located for abutting a primary input to a secondary output and a primary output to a secondary input responsive to tiling of the M instances of the core.

* * * * *